(12) United States Patent
Grundlingh

(10) Patent No.: US 7,151,407 B2
(45) Date of Patent: Dec. 19, 2006

(54) SWITCHED-MODE POWER AMPLIFIER USING LUMPED ELEMENT IMPEDANCE INVERTER FOR PARALLEL COMBINING

(76) Inventor: Johan M. Grundlingh, 5313 Carp Road, R.R. #2, Kinburn, Ontario (CA) K0A 2H0

( * ) Notice: Subject to any disclaimer, the term of this patent is extended or adjusted under 35 U.S.C. 154(b) by 0 days.

(21) Appl. No.: 11/099,916

(22) Filed: Apr. 6, 2005

(65) Prior Publication Data

US 2005/0195031 A1   Sep. 8, 2005

Related U.S. Application Data

(63) Continuation-in-part of application No. 10/615,468, filed on Jul. 8, 2003, now Pat. No. 6,879,209.

(51) Int. Cl.
*H03F 3/217* (2006.01)
(52) U.S. Cl. ..................... 330/251; 333/214
(58) Field of Classification Search ............. 330/10, 330/207 A, 251, 292; 333/214
See application file for complete search history.

(56) References Cited

U.S. PATENT DOCUMENTS 6,285,251 B1 *   9/2001   Dent et al. ................. 330/127

2004/0027199 A1 *   2/2004   Wight et al. ................. 330/251

* cited by examiner

*Primary Examiner*—Steven J. Mottola
(74) *Attorney, Agent, or Firm*—Berkeley Law & Technology Group

(57) ABSTRACT

A switched-mode Class F power amplifier is provided for parallel connection with at least one other like amplifier, within a Chireix architecture, for combining the signals output therefrom. An input component includes at least one active device configured to be alternately switched by a signal input thereto to present an amplified signal corresponding to the input signal and constituting a low output impedance voltage source. A lumped element impedance inverter is provided between the input component and an output resonator component, the impedance inverter being configured for transforming the low output impedance voltage source to instead constitute a high output impedance current source configured for said parallel connection. In accordance with the invention, the negative reactive component values required by the impedance inverter are eliminated and effectively provided by incorporating those values into pre-selected reactive components of the input and output components. Further, a source-drain parasitic capacitance across the active device is eliminated by one or more pre-selected reactive components of the input component, the value(s) of which effectively compensate for the parasitic capacitance.

13 Claims, 6 Drawing Sheets

SWITCHED-MODE POWER AMPLIFIER USING LUMPED ELEMENT IMPEDANCE INVERTER FOR PARALLEL COMBINING

CROSS-REFERENCE TO RELATED APPLICATION

The present application is a continuation-in-part of U.S. application Ser. No. 10/615,468 filed Jul. 8, 2003, now U.S. Pat. No. 6,879,209 issued Apr. 12, 2005, the entire disclosure of which is incorporated by reference herein.

FIELD OF THE INVENTION

The invention relates to circuitry for radio frequency (i.e. "RF" or "wireless") transmitters and, in particular, to a switched-mode power amplifier design and configuration for parallel connection with one or more like amplifiers for combining of the signals output therefrom.

BACKGROUND OF THE INVENTION

Typically, power combiners are used in RF transmitters to combine the output signals of parallel power amplifiers into one high power RF output signal for wireless transmission. In these known transmitter structures the signals are first amplified by the power amplifiers and then they are combined by a separate power combiner to produce a combined amplified signal for transmission. Depending upon the circuit architecture and signal format used, however, it becomes necessary to make trade-offs between reducing power losses and achieving isolation between input signals of the combiner.

The need for efficiency is a particularly important design factor for the highly integrated requirements of transceivers used for wireless local area networks (LANs) and employing modulation formats such as OFDM (Orthogonal Frequency Division Multiplex). Moreover, the assignee of this invention and application has developed signal modulation methods, using OFDM signal format, whereby information signals are deconstructed into independent component signals, these independent signals being more efficiently processed and modulated than the original information signals from which they derive, and then the independent signals are up-converted, amplified and combined prior to transmission. Use of such independent modulated signals presents additional challenges to achieving efficiency at the amplification/combination stages of the transmitter, however, because the conventional model of amplification followed by combining, using known power amplifiers and combiners, is subject to inherent loss and isolation limitations.

The Chireix-type power amplifier, known to persons skilled in the art, represents one of the LINC (Linear amplification with Nonlinear Components) architectures and uses linear, saturated, or switch-mode amplifiers to provide amplification for signals having amplitude as well as phase modulation. It operates by adjusting the phase applied to two amplifiers, and combining the outputs through a combiner to reintroduce the amplitude modulation. An appropriate combiner for the Chireix architecture not only reinserts the amplitude modulation to the signal, it also provides a dynamic adjustment of the load impedance presented to each amplifier (out-phasing). This out-phasing adjustment of the load impedances is such that the DC current through each active device decreases as the combined output amplitude decreases, thereby maintaining high efficiency.

Appropriate combiners for a Chireix-type amplifier do not provide any isolation between the outputs of the two amplifiers. One example of this is a "pseudo" balanced magnetic transformer (i.e. having no center tap to ground connection) connecting the individual amplifier outputs to the two terminals, Input 1 and Input 2, of the input winding 100, as shown in the prior art illustration of FIG. 1. Here the magnetic transformer effectively combines, in series, in the output winding 200, the signals from the individual amplifiers and, for efficiency, the outputs of the individual amplifiers must be low impedance voltage sources. However, it will be understood by the skilled reader that such use of a magnetic transformer inherently introduces significant loss due to the limited Q achievable for the coils on a semiconductor substrate.

Alternatively, the amplifiers in a Chireix-type amplifier architecture can, instead, be connected in parallel if an appropriate impedance transformation is incorporated, that is, if the low impedance voltage source outputs (i.e. the individual amplifier outputs) are transformed into high output impedance current sources. With such a transformation, the high output impedance current source outputs can be connected in parallel, thereby avoiding the need for a magnetic transformer. As known by persons skilled in the art, this transformation can be achieved with a quarter-wave length transmission line, also referred to as an impedance inverter, as shown in the prior art illustration of FIG. 2, wherein the characteristic impedance (Z0) of the two quarter-wave length transmission lines is set to match the output impedance of the amplifier stage to the desired load impedance.

Instead of using such a quarter-wave length transmission line, the impedance inversion (transformation) can also be achieved using a lumped element equivalent circuit, as known to persons skilled in the art. Such a lumped element equivalent for broadband may consist of a series inductor, L, and two shunt negative inductances of equal absolute value, −L, as shown by the prior art illustration of FIG. 3A. Here, a load impedance $Z_L$ is transformed into an input impedance $Z_{in}=\omega^2L^2/Z_L$. Alternatively, the lumped element equivalent circuit shown by the prior art illustration of FIG. 3B could be used for such impedance transformation. As will be appreciated by the skilled reader, these negative inductances, −L, can be realized, for a limited bandwidth (spot frequency) application, with the use of shunt capacitances; however, this is not applicable for a practical Class F amplifier for which such impedance inversion is needed at each of the first, second and third harmonics. Consequently, the realization of such a transformation for Class F amplifier circuits presents an obstacle for the practical design and implementation of such a circuit.

As illustrated by FIG. 4, the known switched-mode Class F amplifier provides a good approximation to a voltage square-wave across the output terminals of an active device 300 (the active device being a transistor in the usual case connected at its source, through a bias inductor 307, to a voltage rail 305) by "shorting" all even-harmonic voltages and "supporting" all odd-harmonic voltages. As a result, the voltage waveform across the output terminals of the active device 300 contains only odd-harmonic components. In addition, this sorting of odd- and even-harmonics results in a current passing through the output terminals of the active device 300 that contains the fundamental, and only even-harmonic components. Such "shorting" and "supporting" of the even and odd harmonics, respectively, is conveniently achieved, up to the third harmonic, with a series resonant circuit 310, 320 tuned to the second harmonic connected across the active device's output terminals, and a parallel resonant circuit 330 and 340 at the third harmonic connected between the output terminal of the active device 300 and the load 350. In operation, the series resonator 310,320 effectively shorts the second harmonic of the input signal (Vin) and supports the third harmonic of the input signal, while the parallel resonator 330,340 effectively blocks the third harmonic of the input signal from the load 350. Since each such harmonic component contains only a voltage component or a current component, the active device 300 does not absorb power other than at the fundamental frequency. Accordingly, as a result of the second and third harmonic resonators, only (approximately) the fundamental frequency signal reaches the load 350 at output terminal 351.

From a practical perspective, it is known that using such resonator circuits to process the input signal only up to its third harmonic components can provide a power-added efficiency of up to about 90%. However, it is also known that this Class F amplifier circuit architecture, where used at high frequencies, presents a design problem relating to the resonator circuits in that a source-drain (emitter-collector) parasitic capacitance results across the active device and causes the resonance values of these resonators to detune. In turn, this means that some level of amplitude for all harmonics of the voltage and current will exist, in practice, at such high frequencies.

By reason of the foregoing limitations, for a Class F, Chiriex-type amplifier architecture there exists a need for new and efficient means to achieve power amplification and combining of modulated signals in transmitters.

SUMMARY OF THE INVENTION

In accordance with the invention, there is provided a switched-mode Class F power amplifier configured for parallel connection with at least one other like amplifier for combining signals output from such parallel connected amplifiers. An input component comprises at least one active device configured to be alternately switched by a signal (i.e. an analog phase modulated signal) input thereto to present an amplified signal corresponding to the input signal, the amplified signal constituting a low output impedance voltage source. A lumped element impedance inverter is provided between the input component and an output resonator component, the impedance inverter being configured for transforming the low output impedance voltage source so as to constitute a high output impedance current source configured for the parallel connection. Negative reactive component values required by the impedance inverter are eliminated and effectively provided by incorporating those negative values into pre-selected reactive components of the input and output components.

Optionally, a source-drain parasitic capacitance across the active device is also eliminated by one or more pre-selected reactive components of the input component, with the value(s) of the pre-selected reactive components being pre-determined to effectively compensate for the parasitic capacitance.

In accordance with another aspect of the invention a plurality of the foregoing amplifiers are connected in parallel for combining signals output from the amplifiers wherein an input component is provided for each of the plurality of amplifiers. A common output resonator component is provided (common to all of the plurality of amplifiers) and a lumped element impedance inverter for each of the plurality of amplifiers between the input component and output component. As for the single amplifier, the negative reactive component values required by each impedance inverter is eliminated and effectively provided by incorporating their values into pre-selected reactive components of the input and output components.

In accordance with a further aspect of the invention there is provided a method for amplifying an input signal to produce an output signal configured for parallel connection with at least one other like output signal for combining the output signals within a Chireix circuit architecture. The input signal is amplified by means of at least one active device configured to be alternately switched by the input signal and an amplified signal corresponding to the input signal is presented, the amplified signal constituting a low output impedance voltage source. A second harmonic resonator configured for shorting a second harmonic signal of said input signal is provided across the active device. The low output impedance voltage source is transformed to constitute a high output impedance current source by means of a lumped element impedance inverter, the high output impedance current source being configured for the parallel connection. A third harmonic resonator blocks a third harmonic signal of the input signal from a load connected to the output signal. Negative reactive component values required by the impedance inverter are eliminated and effectively provided by incorporating those negative values into pre-selected adjacent reactive components of the resonators.

BRIEF DESCRIPTION OF THE DRAWINGS

An exemplary preferred embodiment of the invention is described in detail below with reference to the following drawings in which like references refer to like elements throughout.

DETAILED DESCRIPTION OF THE ILLUSTRATED EMBODIMENT

Surprisingly, the inventor has invented a Class F amplifier configured for parallel connection with at least one other like amplifier, for combining the outputs of such parallel connected amplifiers in a Chireix circuit architecture, which overcomes or avoids the disadvantages associated with the foregoing prior art transformer couplings used for combining amplifier outputs and impedance inverters in the form of quarter-wavelength transmission lines or lumped element equivalents thereto having negative reactive components.

Figure 1:
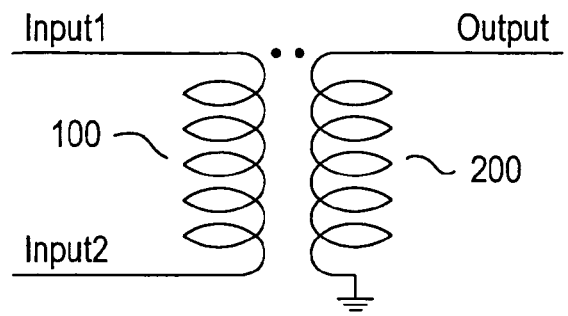
FIG. 1 illustrates a prior art pseudo balanced, transformer (i.e. not having a centre-tap-to-ground connection) for series-combining the output signals (Input 1 and Input 2) of a switched-mode power amplifier.
Figure 2:
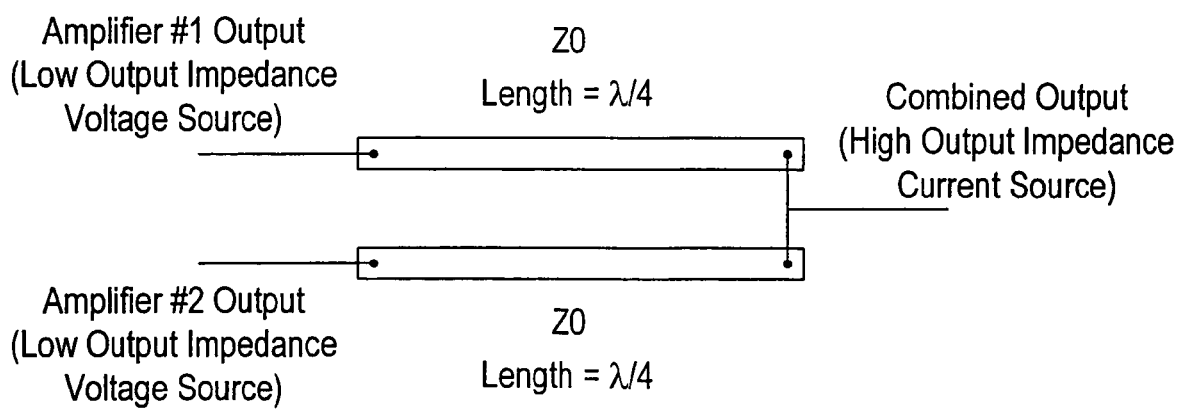
FIG. 2 illustrates a quarter-wavelength ($\lambda/4$) transmission line (impedance inverter), useful for transforming a high output impedance to a low output impedance, as known by persons skilled in the art.
Figure 3A:
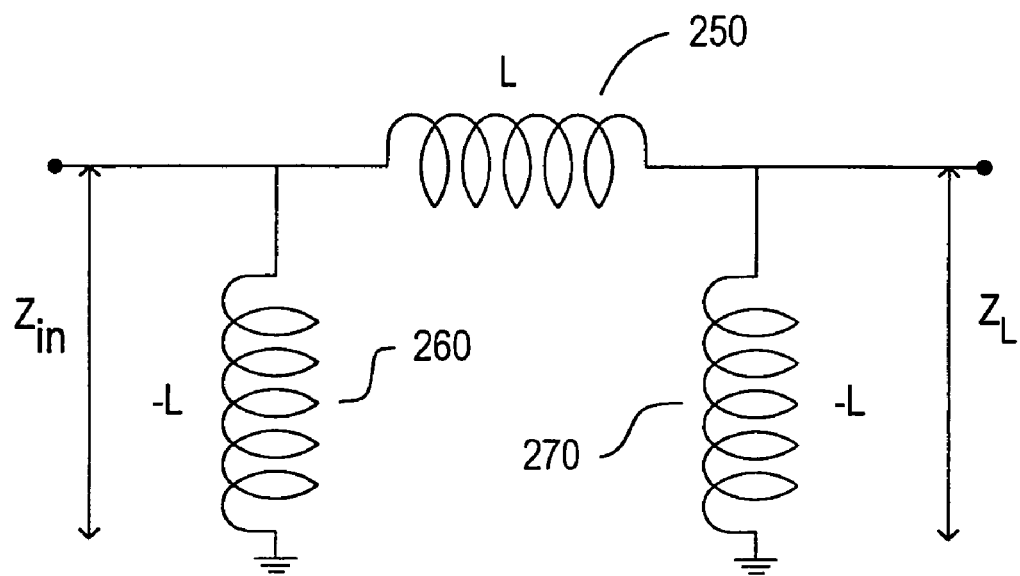
FIGS. 3A and 3B illustrate two different, alternate lumped element circuit equivalents to the foregoing quarter-wavelength transmission line of FIG. 2.
Figure 3B:
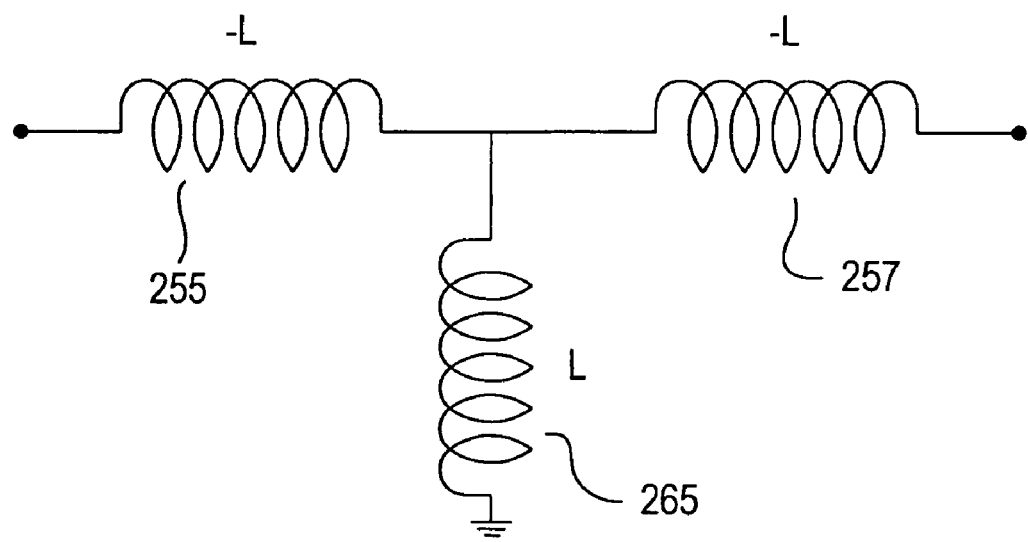
Figure 4:
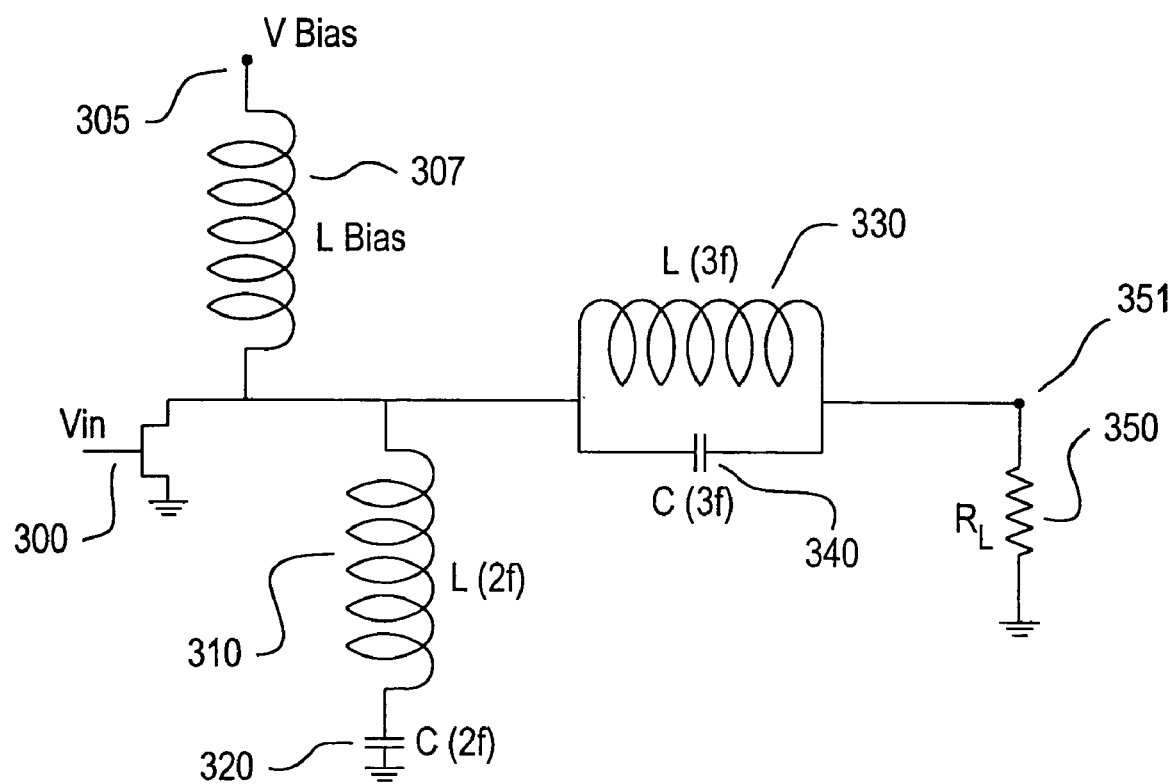
FIG. 4 illustrates a conventional Class F switched-mode power amplifier circuit.
Figure 5:
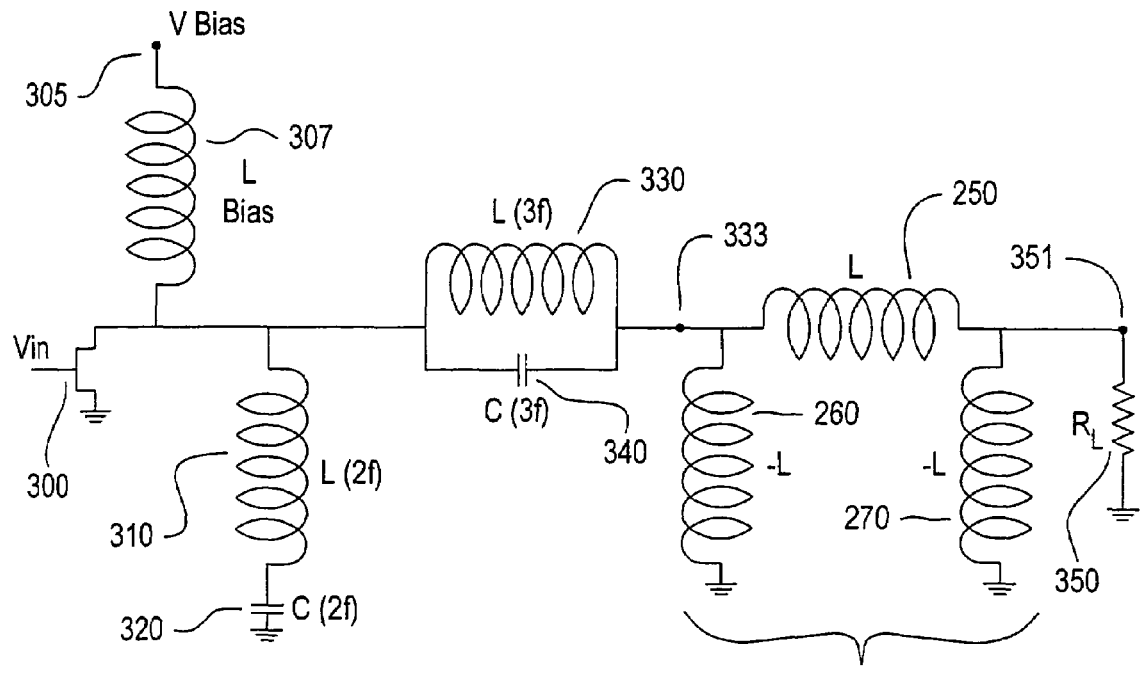
FIG. 5 illustrates a Class F switched-mode power amplifier circuit according to that of FIG. 4 but with the addition of an impedance inverter, per that of FIG. 3A, connected to the output terminal of the amplifier before the load.
Figure 6:
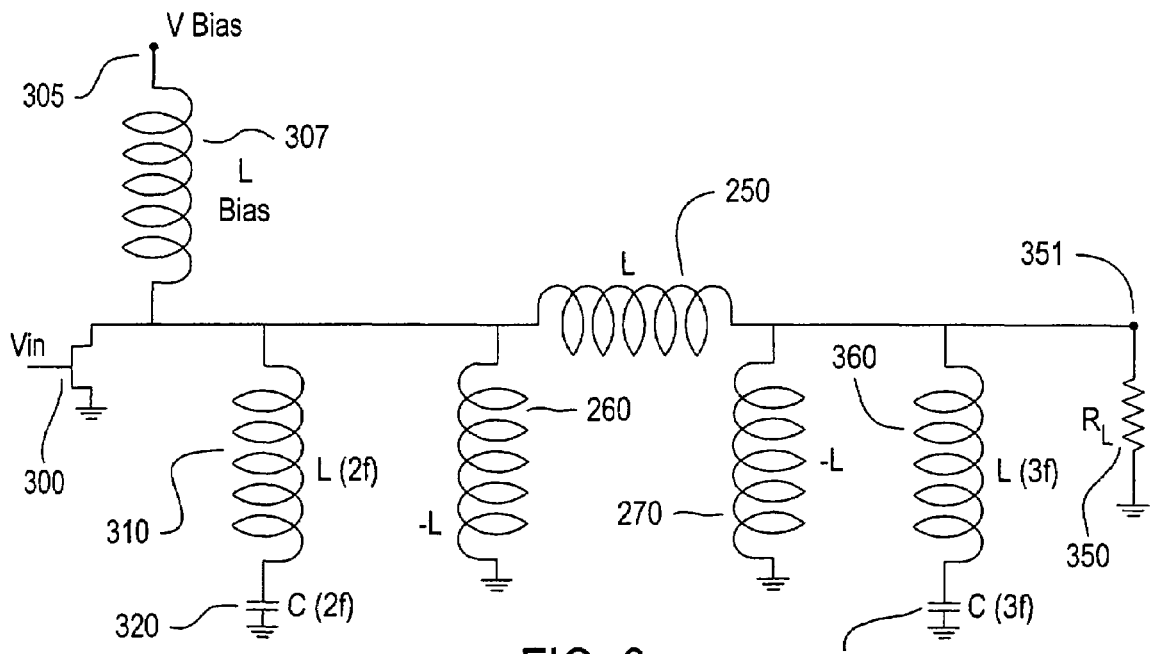
FIG. 6 illustrates a modified Class F amplifier circuit over that of FIG. 5, which includes the impedance inverter (transformer) of FIG. 5 but replaces the parallel third-harmonic-tuned resonator circuit of FIG. 5, with a series third-harmonic-tuned resonator circuit connected across the output terminal of the amplifier to ground.

As illustrated by FIG. 5, the present invention is achieved by first transforming, by means of an impedance inverter 335 (consisting of series positive inductor 250 and shunt negative inductors 260, 270), the output of a Class F amplifier (i.e. at terminal 333) from that of a low impedance voltage source to a high impedance current source so that such output-transformed amplifier may be connected in parallel with another like amplifier configuration to combine the outputs of the two amplifiers. Then, as illustrated by FIG. 6, the parallel third harmonic resonator 330, 340 is transformed through that impedance inverter 335 into a series third harmonic resonator 360, 370 (i.e. the parallel resonator 330,340 is replaced by a series resonator 360, 370 across the output terminal 351 and ground). Then, as illustrated by FIG. 7 (which shows two such amplifier circuits 500, 501, each configured in accordance with the present invention and connected in parallel to present an output signal at terminal 550 representing an amplification and combination of input signals Vin1 and Vin2) the negative impedances 260, 270 are eliminated by incorporating those negative impedance values (effects) into the values of pre-selected existing reactive components adjacent to them.

Figure 7:
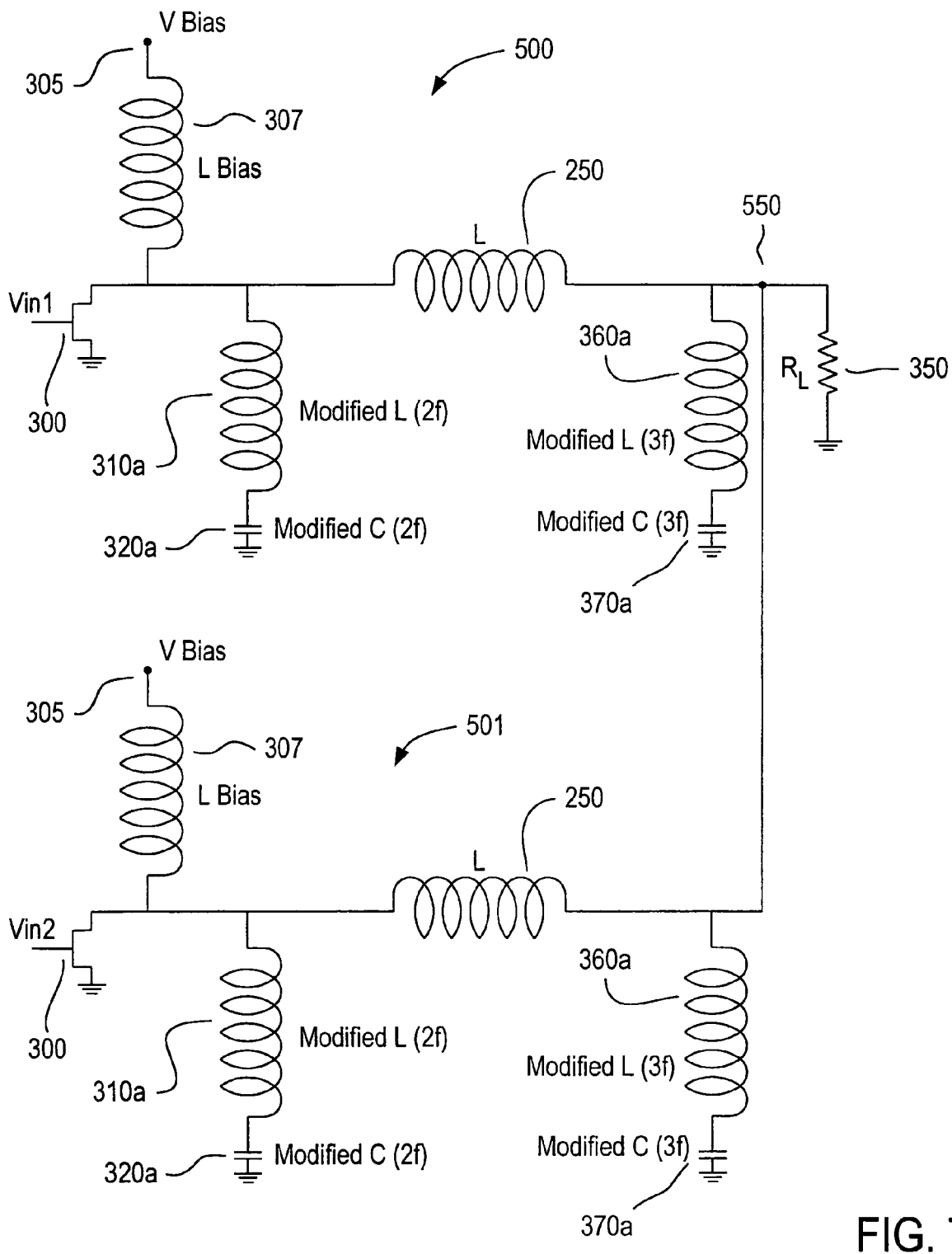
FIG. 7 illustrates a further modified Class F amplifier over that of FIG. 6, in accordance with the present invention, in parallel connection with a like amplifier according to the invention, wherein the left-most negative inductor (−L) of the impedance inverter (transformer) of FIG. 6 is incorporated into the series second-harmonic-tuned resonator circuit of FIG. 6 to produce the modified series second-harmonic-tuned resonator circuit shown in this figure and the right-most negative inductor (−L) of the impedance inverter (transformer) of FIG. 6 is incorporated into the series third-harmonic-tuned resonator circuit of FIG. 6 to produce the modified series third-harmonic-tuned resonator circuit shown in this figure; and, FIG. 8 illustrates modified parallel-connected circuit of Class F amplifiers configured in accordance with the invention, over that of FIG. 7, in which the output third harmonic resonator components are replaced by one equivalent output resonator component common to both amplifiers.

Specifically, as shown by FIG. 7, the negative impedance 260 is incorporated into the series second harmonic resonator 310,320 to form a modified series second harmonic resonator 310a, 320a in the example shown. Alternatively, if the source bias voltage 305 is stable, that negative impedance could be incorporated into the source bias inductor 307. Also as illustrated by FIG. 7, the negative impedance 270 is incorporated into the series third harmonic resonator 360, 370 in the example shown to form a modified series third harmonic resonator 360a,370a.

Figure 8:
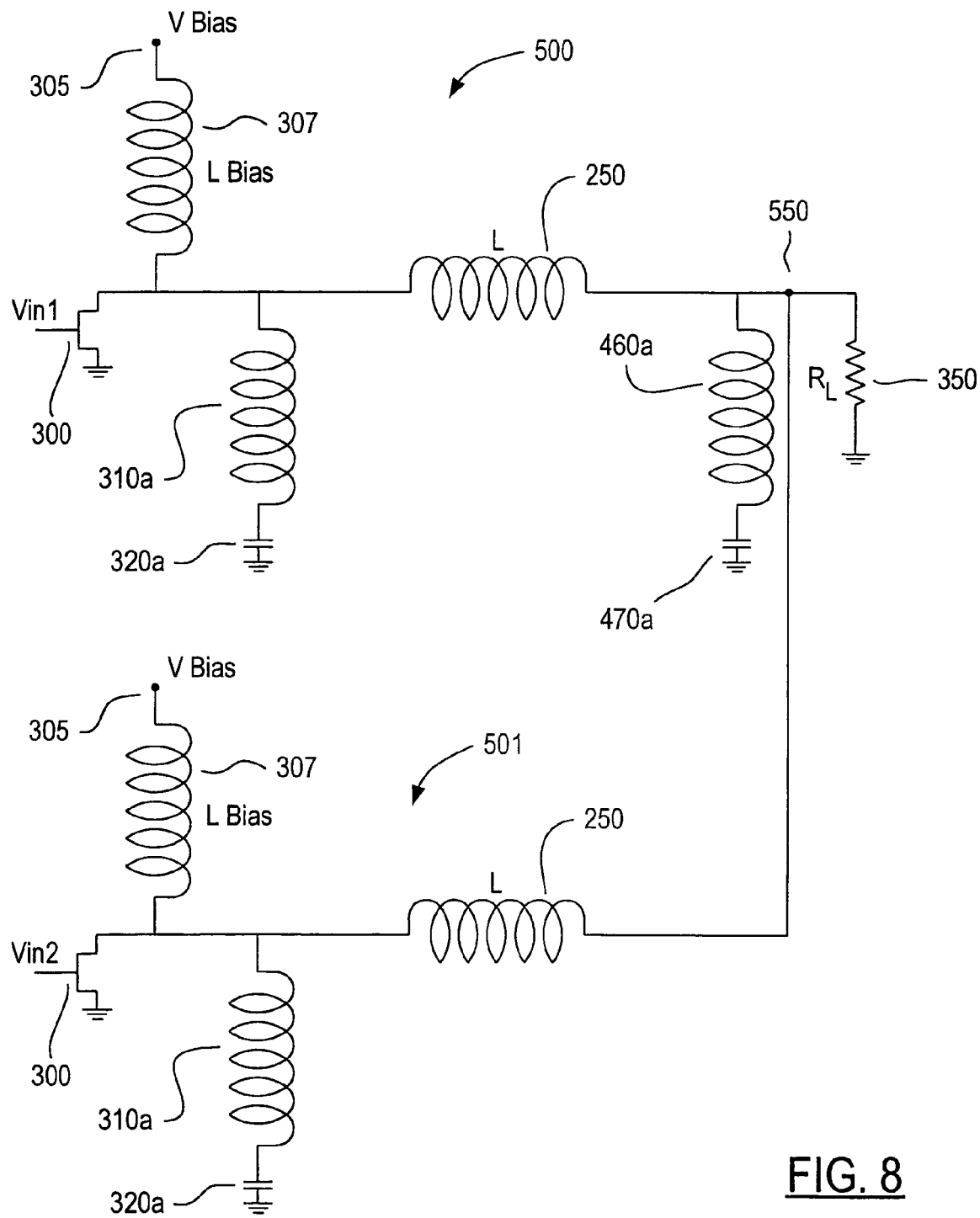

Further, since this modified third harmonic resonator circuit 360a,370a of the amplifier 500 is in parallel connection with the corresponding resonator circuit 360a,370a of the parallel-connected like amplifier 501, these resonator circuits may be replaced by one equivalent resonator circuit 460a, 470a, as shown by FIG. 8.

Moreover, the inventor has also advantageously eliminated the aforementioned source-drain parasitic capacitance of the Class F amplifier which occurs at high frequencies, by compensating for its presence in the pre-selection of the modified values of the components 310a,320a of the second harmonic resonator.

It has also been determined by the assignee of this invention that the positive inductance 250 of the impedance inverter can be realized as a wire-bond in a semiconductor product implementation of this circuit, whereby the actual Chireix (parallel) signal combining takes place off die at the package pin. The means and method of performing such a wire-bond realization is described in detail in a co-pending application assigned to the same assignee as this application, entitled "Integrated Circuit Incorporating Wire Bond Inductance" which was filed on 30 Jun., 2003.

The individual electronic and processing functions utilised in the foregoing described embodiment are, individually, well understood by those skilled in the art. Appropriate values to be pre-selected for the surrounding reactive components, for given signal frequencies, to incorporate the negative reactive values of the impedance inverter in accordance with the invention, can be readily determined, as needed, by such skilled persons. It is to be understood by the skilled reader that a variety of other implementations of the invention, apart from the specific embodiment illustrated herein, may be devised for substitution. The claimed invention herein is intended to encompass all such alternative implementations, substitutions and equivalents. Persons skilled in the field of electronic and communication design will be readily able to apply the present invention to an appropriate implementation for a given application.

Consequently, it is to be understood that the particular embodiments shown and described herein by way of illustration are not intended to limit the scope of the invention claimed by the inventors/assignee which is defined by the appended claims.

What is claimed is:

1. A power amplifier configured for parallel connection with at least one other amplifier for combining signals output from such parallel connected amplifiers, said amplifier comprising:
   (a) an active input component configured to be switched by a signal input thereto to present an amplified signal constituting a low output impedance voltage source;
   (b) an output resonator component; and,
   (c) a lumped element impedance inverter connected between said input component and said output component, said impedance inverter configured for transforming said, low output impedance voltage source so as to constitute a high output impedance current source, and said high output impedance current source configured for said parallel connection;
   wherein negative reactive component values theoretically required by said impedance inverter are actually incorporated into pro-selected reactive components of said input and output components, and wherein said output resonator component comprises an inductor and a capacitor coupled in series, at least one of said inductor or said capacitor, or combinations thereof, incorporating a negative reactive component of said lumped element impedance inverter, said series coupled inductor and capacitor being parallel coupled to a ground reference.

2. An apparatus, comprising:
   means for amplifying an input signal, said amplifying means being capable of providing an output signal corresponding to an amplified version of the input signal;
   means for resonating a resonant frequency, said resonating means being coupled to an output of said amplifying means; and
   means for inverting an impedance, said impedance inverting means being coupled between said amplifying means and said resonating means, said impedance inverting means being capable of transforming an output of said amplifying means from a voltage source having a lower output impedance to a current source having a higher output impedance;

wherein said inverting means comprises one or more negative valued theoretical reactive components realized as one or more positive valued reactive components of at least one of said amplifying means or said resonating means, or combinations thereof, and wherein said resonating means comprises means for realizing an inductance and means for realizing a capacitance coupled in series, at least one of said inductance realizing means or said capacitance realizing means, or combinations thereof, incorporating a negative reactive component of said impedance inverting means, said series coupled inductance realizing means and said capacitance realizing means being parallel coupled to a ground reference.

3. An apparatus as claimed in claim 2, said amplifying means being capable of amplifying an analog phase modulated signal.

4. An apparatus as claimed in claim 2, further comprising:
one or more additional means for amplifying an input signal; and
one or more additional inverting means being coupled to corresponding said one or more additional amplifying means;
said resonating means being common to at least said amplifying means and at least one of said one or more additional amplifying means;
wherein at least one or more of said one or more additional inverting means comprises one or more negative valued theoretical reactive components realized as one or more positive valued reactive components of at least one of said amplifying means or said resonating means, or combinations thereof.

5. An apparatus as claimed in claim 2, further comprising means for attenuating the output of said amplifying means near a second harmonic of the output signal.

6. An apparatus as claimed in claim 2, said resonating means being capable of resonating near a third harmonic of the output signal.

7. An apparatus as claimed in claim 2, said resonating means comprising at least one of means for providing an inductive reactance or means for providing a capacitive reactance, or combinations thereof, at least one or more of said means for providing an inductive reactance or said means for providing a capacitive reactance being capable of at least partially compensating for a reactance value of said inverting means.

8. An apparatus, comprising:
an active circuit capable of amplifying an input signal to provide an output signal corresponding to an amplified version of the input signal;
a first resonator capable of resonating at a second harmonic of the output signal;
a second resonator capable of resonating at a third harmonic of the output signal; and
an impedance inverter coupled to at least one of said first resonator or said second resonator, or a combination thereof, said impedance inverter being capable of at least partially transforming a the lower impedance voltage source of said active device to a higher impedance current source;
at least one of said first resonator or said second resonator, or a combination thereof at least partially realizing a theoretical negative valued reactive element of said impedance inverter as a non-negative valued reactive element; and
wherein said second resonator comprises an inductor and a capacitor coupled in series, and at least one of said inductor or said capacitor, or combinations thereof, incorporating a negative reactive component of said impedance inverter, said series coupled inductor and capacitor being parallel coupled to a ground reference.

9. An apparatus as claimed in claim 8, said active circuit being capable of amplifying an analog phase modulated signal.

10. An apparatus as claimed in claim 8, further comprising:
one or more additional active circuits capable of amplifying an input signal; and
one or more additional impedance inverters being coupled to corresponding said one or more additional active circuits;
said second resonator being common to at least said active circuit and at least one of said one or more additional active circuits, and having one or more component values accommodating a number of said active circuit and said one or more additional active circuits;
wherein at least one or more of said one or more additional impedance inverters comprises one or more negative valued theoretical reactive components realized as one or more positive valued reactive components of at least one of said active circuits, said first resonator, or said second resonator, or combinations thereof.

11. An apparatus as claimed in claim 8, said first resonator being capable of attenuating an output of said active circuit near the second harmonic of the output signal.

12. An apparatus as claimed in claim 8, said second resonator being capable of resonating near the third harmonic of the output signal while said first resonator attenuates an output of said active circuit near the second harmonic of the output signal.

13. An apparatus as claimed in claim 8, one or more of said first resonator or said second resonator, or combinations thereof, comprising at least one or more of an inductive reactance element or a capacitive reactance element, or combinations thereof, at least one or more of said inductive reactance element or means or said capacitive reactance being capable of at least partially comprising a reactance value of said impedance inverter.

* * * * *

UNITED STATES PATENT AND TRADEMARK OFFICE
CERTIFICATE OF CORRECTION

PATENT NO. : 7,151,407 B2 Page 1 of 1
APPLICATION NO. : 11/099916
DATED : December 19, 2006
INVENTOR(S) : Johan M. Grundlingh It is certified that error appears in the above-identified patent and that said Letters Patent is hereby corrected as shown below:

On the title page, item [63] Related U.S. Application Data, please replace "Continuation-in-part" with --Continuation--

Signed and Sealed this

Eighth Day of June, 2010

David J. Kappos
*Director of the United States Patent and Trademark Office*